(12) United States Patent
Kasahara

(10) Patent No.: US 10,108,088 B2
(45) Date of Patent: Oct. 23, 2018

(54) RADIATION-SENSITIVE COMPOSITION AND PATTERN-FORMING METHOD

(71) Applicant: JSR CORPORATION, Tokyo (JP)

(72) Inventor: Kazuki Kasahara, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/435,862

(22) Filed: Feb. 17, 2017

(65) Prior Publication Data
US 2017/0242336 A1    Aug. 24, 2017

Related U.S. Application Data

(60) Provisional application No. 62/297,444, filed on Feb. 19, 2016.

(51) Int. Cl.
| | | |
|---|---|---|
| *G03F 7/004* | (2006.01) |
| *B32B 5/16* | (2006.01) |
| *G03F 7/16* | (2006.01) |
| *G03F 7/20* | (2006.01) |
| *G03F 7/32* | (2006.01) |
| *G03F 7/38* | (2006.01) |

(52) U.S. Cl.
CPC .............. *G03F 7/0043* (2013.01); *B32B 5/16* (2013.01); *G03F 7/0045* (2013.01); *G03F 7/162* (2013.01); *G03F 7/168* (2013.01); *G03F 7/2004* (2013.01); *G03F 7/2037* (2013.01); *G03F 7/322* (2013.01); *G03F 7/38* (2013.01)

(58) Field of Classification Search
CPC ...... G03F 7/004; G03F 7/0043; G03F 7/0045; G03F 7/162; G03F 7/168; G03F 7/2004; G03F 7/322; G03F 7/325; G03F 7/38; G03F 7/2037; G03F 7/092; B32B 5/16
USPC .... 430/270.1, 322, 325, 329, 331, 434, 435, 430/273.1; 428/172
See application file for complete search history.

(56) References Cited

U.S. PATENT DOCUMENTS

| | | | | |
|---|---|---|---|---|
| 8,198,016 B2* | 6/2012 | Hatakeyama | ............ | G03F 7/40 430/271.1 |
| 9,716,038 B2* | 7/2017 | Chen | ................ | H01L 21/76832 |
| 2009/0297784 A1* | 12/2009 | Xu | .......................... | G03F 7/039 428/172 |
| 2013/0129995 A1* | 5/2013 | Ouattara | ................ | G03F 7/092 428/209 |
| 2013/0230656 A1* | 9/2013 | Amako | .................. | C08G 77/58 427/387 |
| 2015/0064904 A1* | 3/2015 | Yao | ........................ | C08G 77/58 438/694 |

FOREIGN PATENT DOCUMENTS

| | | | | |
|---|---|---|---|---|
| JP | H08-146610 A | | 6/1996 | |
| JP | H11-125907 A | | 5/1999 | |
| JP | 2000-298347 A | | 10/2000 | |
| JP | 2002317151 A | * | 10/2002 | |
| JP | 2014015518 A | * | 1/2014 | |
| WO | WO 2017170385 A1 | * | 10/2017 | ............. C01G 23/04 |

OTHER PUBLICATIONS

Machine translation of JP 2007-169604 (no date).*
Machine translation of JP 2014-0155518(no date).*
Machine translation of JP 2002-317151 (no date).*

* cited by examiner

*Primary Examiner* — Amanda C. Walke
(74) *Attorney, Agent, or Firm* — Oblon, McClelland, Maier & Neustadt, L.L.P.

(57) ABSTRACT

A radiation-sensitive composition includes particles including a metal oxide as a principal component, a radiation-sensitive acid generator, and an organic solvent. A metal atom constituting the metal oxide includes a first metal atom that is a zinc atom, a boron atom, an aluminum atom, a gallium atom, a thallium atom, a germanium atom, an antimony atom, a bismuth atom, a tellurium atom, or a combination thereof. A van der Waals volume of an acid generated from the radiation-sensitive acid generator is no less than $2.0 \times 10^{-28}$ m$^3$. A percentage content of the first metal atom with respect to total metal atoms in the radiation-sensitive composition is no less than 50 atomic %.

20 Claims, No Drawings

RADIATION-SENSITIVE COMPOSITION AND PATTERN-FORMING METHOD

CROSS-REFERENCE TO RELATED APPLICATIONS

The present application claims priority to U.S. Provisional Patent Application No. 62/297,444, filed Feb. 19, 2016, the contents of which are incorporated herein by reference in their entirety.

BACKGROUND OF THE INVENTION

Field of the Invention

The present invention relates to a radiation-sensitive composition and a pattern-forming method.

Discussion of the Background

General radiation-sensitive compositions used for microfabrication by lithography generate acids in regions by irradiation with: extreme ultraviolet rays such as an ArF excimer laser beam and a KrF excimer laser beam; electromagnetic waves such as extreme ultraviolet ray (EUV); charged particle rays such as an electron beam; and the like, making a difference in a rate of dissolution in a developer solution between the light-exposed regions and light-unexposed regions, through a chemical reaction in which the acid acts as a catalyst, whereby a pattern is formed on a substrate. The pattern thus formed may be used as a mask and the like upon processing of the substrate.

Miniaturization in processing techniques has been accompanied by demands for improved resist performances of such radiation-sensitive compositions. To address the demands, types, molecular structures and the like of polymers, acid generating agents and other components to be used in a composition have been studied, and combinations thereof have also been extensively studied (refer to Japanese Unexamined Patent Application, Publication Nos. H11-125907, H8-146610, and 2000-298347).

SUMMARY OF THE INVENTION

According to one aspect of the present invention, a radiation-sensitive composition includes particles including a metal oxide as a principal component, a radiation-sensitive acid generator, and an organic solvent. A metal atom constituting the metal oxide includes a first metal atom that is a zinc atom, a boron atom, an aluminum atom, a gallium atom, a thallium atom, a germanium atom, an antimony atom, a bismuth atom, a tellurium atom, or a combination thereof. A van der Waals volume of an acid generated from the radiation-sensitive acid generator is no less than $2.0 \times 10^{-28}$ $m^3$. A percentage content of the first metal atom with respect to total metal atoms in the radiation-sensitive composition is no less than 50 atomic %.

According to another aspect of the present invention, a pattern-forming method includes applying the radiation-sensitive composition to form a film on a substrate. The film is exposed. The film exposed is developed.

DESCRIPTION OF THE EMBODIMENTS

According to an embodiment of the invention, a radiation-sensitive component comprises: particles comprising a metal oxide as a principal component (hereinafter, may be also referred to as "(A) particles" or "particles (A)"); a radiation-sensitive acid generator (hereinafter, may be also referred to as "(B) acid generator" or "acid generator (B)"); and an organic solvent (hereinafter, may be also referred to as "(C) solvent" or "solvent (C)"), wherein: a metal atom constituting the metal oxide comprises a first metal atom that is a zinc atom, a boron atom, an aluminum atom, a gallium atom, a thallium atom, a germanium atom, an antimony atom, a bismuth atom, a tellurium atom, or a combination thereof; and a van der Waals volume of an acid generated from the radiation-sensitive acid generator is no less than $2.0 \times 10^{-28}$ $m^3$; and a percentage content of the first metal atom with respect to total metal atoms in the composition is no less than 50 atomic %.

According to another embodiment of the present invention made for solving the aforementioned problems, a pattern-forming method comprises: applying the radiation-sensitive composition on one face side of a substrate; exposing a film obtained by the applying; and developing the film exposed.

The term "metal oxide" as referred to means a compound that comprises at least a metal atom and an oxygen atom. The term "principal component" as referred to means a component which is of the highest content, for example, a component the content of which is no less than 50% by mass. The term "particles" as referred to means, for example, a substance that has an average particle diameter of no less than 1 nm. The term "total metal atoms" as referred to is a concept encompassing metalloid atoms. The term "metalloid atom" as referred to means a boron atom, a silicon atom, a germanium atom, an arsenic atom, an antimony atom, and a tellurium atom.

The radiation-sensitive composition and the pattern-forming method according to the embodiments of the present invention enable a pattern superior in resolution to be formed with high sensitivity. Therefore, these can be suitably used for a processing process of semiconductor devices, and the like, in which further progress of miniaturization is expected in the future. Hereinafter, the embodiments will be explained in detail.

Radiation-Sensitive Composition

The radiation-sensitive composition comprises (A) particles, (B) an acid generator, and (C) a solvent. The composition for film formation may further contain other optional component within a range not leading to impairment of the effects of the present invention. The metal atom constituting the metal oxide, which is the principal component of the particles (A), comprises the first metal atom that is a zinc atom, a boron atom, an aluminum atom, a gallium atom, a thallium atom, a germanium atom, an antimony atom, a bismuth atom, a tellurium atom, or a combination thereof. A van der Waals volume of an acid generated from the acid generator (B) is no less than $2.0 \times 10^{-28}$ $m^3$. A percentage content of the first metal atom with respect to total metal atoms in the radiation-sensitive composition is no less than 50 atomic %.

Due to comprising the particles (A), the acid generator (B) and the solvent (C), with the van der Waals volume of an acid generated from the acid generator (B) being no less than the lower limit, and the percentage content of the first metal atom with respect to total metal atoms in the composition being no less than the lower limit, the radiation-sensitive composition enables a pattern superior in resolution to be formed with high sensitivity. Although not necessarily clarified, the reason for achieving the effects described above due to the radiation-sensitive composition having the aforementioned constitution is inferred as in the following, for example. Specifically, in a film formed from the radiation-sensitive composition, the first metal atom comprised in the particles (A) and the like in the light-exposed regions absorbs exposure light and releases secondary electrons, and then an acid is generated from the acid generator (B) by an action of the secondary electrons and the like. The acid accelerates a structural change of the particles (A) to change a solubility in a developer solution, thereby enabling a pattern to be formed on the film. Here, the first metal atom is more likely to release the secondary electrons than other metal atoms such as transition metal atoms. Meanwhile, the particles (A) that comprise as a principal component a metal oxide comprising the first metal atom are likely to have a solubility in a developer solution appropriately changed by virtue of the acid. Furthermore, the acid generator (B) is capable of appropriately inhibiting a diffusion phenomenon of the acid in the film by virtue of the comparatively great van der Waals volume of the acid to be generated, thereby enabling inhibition of unwanted chemical reactions in the light-unexposed regions. Moreover, since the percentage content of the first metal atom with respect to total metal atoms is no less than the lower limit, the radiation-sensitive composition enables the release of the secondary electrons by the first metal atom to be sufficiently promoted. It is considered that, as a result of these features, the radiation-sensitive composition is superior in sensitivity and resolution.

The lower limit of the percentage content of the first metal atom with respect to total metal atoms in the radiation-sensitive composition is 50 atomic %, preferably 80 atomic %, more preferably 95 atomic %, and further more preferably 99 atomic %. Due to the percentage content of the first metal atom being no less than the lower limit, more effective promotion of the release of the secondary electrons by the first metal atom is enabled, whereby the sensitivity and resolution of the radiation-sensitive composition can be further improved.

(A) Particles

The particles (A) comprise a metal oxide as a principal component. It is to be noted that since the particles (A) comprise the metal oxide as the principal component, the particles (A) contribute also to improving etching resistance of a pattern formed from the radiation-sensitive composition.

The lower limit of an average particle diameter of the particles (A) is preferably 1.1 nm, and more preferably 1.2 nm. Meanwhile, the upper limit of the average particle diameter is preferably 20 nm, more preferably 10 nm, further more preferably 3.0 nm, and particularly preferably 2.5 nm. When the average particle diameter of the particles (A) falls within the above range, more effective promotion of the generation of the secondary electrons by the particles (A) is enabled, whereby the sensitivity and resolution of the radiation-sensitive composition can be further improved. The "average particle diameter" as referred to means a harmonic mean particle size on the basis of scattered light intensity, as measured by DLS (Dynamic Light Scattering) using a light scattering measurement device.

Metal Oxide

The metal atom constituting the metal oxide, which is the principal component of the particles (A), comprises the first metal atom that is a zinc atom, a boron atom, an aluminum atom, a gallium atom, a thallium atom, a germanium atom, an antimony atom, a bismuth atom, a tellurium atom, or a combination thereof. The lower limit of the percentage content of the first metal atom with respect to total metal atoms constituting the metal oxide is preferably 50 atomic %, more preferably 80 atomic %, and further more preferably 99 atomic %. When the percentage content of the first metal atom is no less than the lower limit, release of the secondary electrons in the light-exposed regions of the film formed from the radiation-sensitive composition, and change of solubility of the particles (A) in a developer solution by the acid generated from the acid generator (B) are enabled to be further promoted, thereby enabling the sensitivity and resolution of the radiation-sensitive composition to be further improved. It is to be noted that the percentage content of the first metal atom contained may also be 100 atomic %.

As the first metal atom, a zinc atom and a metalloid atom are preferred, and a zinc atom and an antimony atom are more preferred. By using these metal atoms as the first metal atom, further improvements of the sensitivity and resolution of the radiation-sensitive composition are enabled. Either one type, or a combination of two or more types, of these metal atoms may be used as the first metal atom.

The metal oxide may contain an additional atom, other than the metal atom and the oxygen atom. Examples of the additional atom include a carbon atom, a hydrogen atom, a nitrogen atom, a phosphorus atom, a sulfur atom, a halogen atom, and the like.

The lower limit of a total percentage content of the metal atom and the oxygen atom in the metal oxide is preferably 5% by mass, more preferably 10% by mass, and further more preferably 25% by mass. Meanwhile, the upper limit of the total percentage content of the metal atom and the oxygen atom in the metal oxide is preferably 99.9% by mass, more preferably 80% by mass, and further more preferably 70% by mass. When the total percentage content of the metal atom and the oxygen atom falls within the above range, more effective promotion of the generation of the secondary electrons by the particles (A) is enabled to, whereby the sensitivity of the radiation-sensitive composition can be further improved. It is to be noted that the total percentage content of the metal atom and the oxygen atom may also be 100% by mass.

The metal oxide is exemplified by: a metal oxide constituted only of a metal atom and an oxygen atom; a metal oxide comprising a metal atom and an organic ligand; and the like. Exemplary metal oxide comprising a metal atom and an organic ligand is a molecule comprising a repeating structure of: (metal atom-organic ligand-metal atom). As the organic ligand, a ligand derived from (a) an organic acid is preferred. Exemplary ligand derived from the organic acid (a) is an anion generated by eliminating one or a plurality of protons from the organic acid (a). The "organic acid" as referred to means an acidic organic compound, and the "organic compound" as referred to means a compound having at least one carbon atom.

When the particles (A) comprising as a principal component the metal oxide that comprises the metal atom and the ligand derived from the organic acid (a), further improvements of the sensitivity and resolution of the radiation-sensitive composition are enabled. Although not necessarily clarified, the reason for achieving the effects described above due to the radiation-sensitive composition having the aforementioned constitution is inferred as in the following, for example. Specifically, it is considered that the ligand derived from the organic acid (a) is present in the vicinity of a surface of the particles (A) due to an interaction with the metal atom, to thereby improve the solubility of the particles (A) in a developer solution. Meanwhile, it is considered that in the light-exposed regions of the film formed from the radiation-sensitive composition, the ligand derived from the organic acid (a) is eliminated from the particles (A) due to a structural change of the particles (A), whereby the solubility of the particles (A) in a developer solution is changed more greatly. The sensitivity and resolution of the radiation-sensitive composition are considered to be further improved as a result of the foregoing.

The lower limit of pKa of the organic acid (a) is preferably 0, more preferably 1, further more preferably 1.5, and particularly preferably 2. Meanwhile, the upper limit of the pKa is preferably 7, more preferably 6, further more preferably 5.5, and particularly preferably 5. When the pKa of the organic acid (a) falls within the above range, it is possible to adjust the interaction between the ligand derived from the organic acid (a) and the metal atom to be moderately weak, whereby further improvements of the sensitivity and resolution of the radiation-sensitive composition are enabled. Here, in the case of the organic acid (a) being a polyvalent acid, the pKa of the organic acid (a) as referred to means a primary acid dissociation constant, i.e., a logarithmic value of a dissociation constant for dissociation of the first proton.

The organic acid (a) may be either a low molecular weight compound or a high molecular weight compound, and a low molecular weight compound is preferred in light of adjusting the interaction with the metal atom to be more appropriately weak. The "low molecular weight compound" as referred to means a compound having a molecular weight of no greater than 1,500, whereby the "high molecular weight compound" as referred to means a compound having a molecular weight of greater than 1,500. The lower limit of the molecular weight of the organic acid (a) is preferably 50, and more preferably 70. Meanwhile, the upper limit of the molecular weight is preferably 1,000, more preferably 500, further more preferably 400, and particularly preferably 300. When the molecular weight of the organic acid (a) falls within the above range, it is possible to adjust solubility of the particles (A) in a developer solution to be more appropriate, whereby the sensitivity and resolution of the radiation-sensitive composition can be further improved.

The organic acid (a) is exemplified by a carboxylic acid, a sulfonic acid, a sulfinic acid, an organic phosphinic acid, an organic phosphonic acid, a phenol, an enol, a thiol, an acid imide, an oxime, a sulfonamide, and the like.

Examples of the carboxylic acid include:

monocarboxylic acids such as formic acid, acetic acid, propionic acid, butanoic acid, pentanoic acid, hexanoic acid, heptanoic acid, octanoic acid, nonanoic acid, decanoic acid, 2-ethylhexanoic acid, tiglic acid, oleic acid, acrylic acid, methacrylic acid, trans-2,3-dimethylacrylic acid, stearic acid, linoleic acid, linolenic acid, arachidonic acid, salicylic acid, benzoic acid, p-aminobenzoic acid, iodobenzoic acid (such as 2-iodobenzoic acid, 3-iodobenzoic acid and 4-iodobenzoic acid), monochloroacetic acid, dichloroacetic acid, trichloroacetic acid, o-toluic acid, m-toluic acid, p-toluic acid, trifluoroacetic acid, pentafluoropropionic acid, gallic acid and shikimic acid;

dicarboxylic acids such as oxalic acid, malonic acid, maleic acid, methylmalonic acid, fumaric acid, adipic acid, sebacic acid, phthalic acid and tartaric acid;

carboxylic acids having no less than 3 carboxy groups such as citric acid; and the like.

Examples of the sulfonic acid include benzenesulfonic acid, p-toluenesulfonic acid, and the like.

Examples of the sulfinic acid include benzenesulfinic acid, p-toluenesulfinic acid, and the like.

Examples of the organic phosphinic acid include diethylphosphinic acid, methylphenylphosphinic acid, diphenylphosphinic acid, and the like.

Examples of the organic phosphonic acid include methylphosphonic acid, ethylphosphonic acid, t-butylphosphonic acid, cyclohexylphosphonic acid, phenylphosphonic acid, and the like.

Examples of the phenol include: monovalent phenols such as phenol, cresol, 2,6-xylenol, and naphthol;

divalent phenols such as catechol, resorcinol, hydroquinone and 1,2-naphthalenediol;

phenols having a valency of no less than 3 such as pyrogallol and 2,3,6-naphthalenetriol; and the like.

Examples of the enol include 2-hydroxy-3-methyl-2-butene, 3-hydroxy-4-methyl-3-hexene, and the like.

Examples of the thiol include mercaptoethanol, mercaptopropanol, and the like.

Examples of the acid imide include:

carboxylic imides such as maleimide and succinimide;

sulfonic imides such as a di(trifluoromethanesulfonic acid) imide and di(pentafluoroethanesulfonic acid) imide; and the like.

Examples of the oxime include:

aldoximes such as benzaldoxime and salicylaldoxime;

ketoximes such as diethylketoxime, methylethylketoxime and cyclohexanoneoxime; and the like.

Examples of the sulfonamide include methylsulfonamide, ethylsulfonamide, benzenesulfonamide, toluenesulfonamide, and the like.

In light of further improving the sensitivity and resolution of the radiation-sensitive composition, as the organic acid (a), the carboxylic acid is preferred; the monocarboxylic acid is more preferred; and methacrylic acid, tiglic acid, benzoic acid and m-toluic acid are further more preferred.

As the metal oxide, a metal oxide comprising zinc and a ligand derived from methacrylic acid; a metal oxide comprising zinc and a ligand derived from benzoic acid; a metal oxide comprising zinc and a ligand derived from tiglic acid; a metal oxide comprising bismuth and a ligand derived from methacrylic acid; a metal oxide comprising tellurium and a ligand derived from methacrylic acid; a metal oxide comprising germanium and a ligand derived from benzoic acid; a metal oxide comprising boron and a ligand derived from benzoic acid; a metal oxide comprising aluminum and a ligand derived from benzoic acid; a metal oxide comprising gallium and a ligand derived from tiglic acid; a metal oxide comprising thallium and a ligand derived from tiglic acid; a metal oxide constituted of zinc and oxygen atoms; and a metal oxide comprising antimony and a ligand derived from tiglic acid are preferred, among which the metal oxide comprising zinc and a ligand derived from benzoic acid is more preferred.

The lower limit of a percentage content of the metal oxide in the particles (A) is preferably 60% by mass, more preferably 80% by mass, and further more preferably 95% by mass. It is to be noted that the percentage content of the metal oxide may also be 100% by mass. When the percentage content of the metal oxide is no less than the lower limit, further improvements of the sensitivity and resolution of the radiation-sensitive composition are enabled. The particles (A) may include either only a single type, or two or more types, of the metal oxides.

The lower limit of the number of the first metal atoms comprised in the particles (A) is preferably 2, and more preferably 4. Meanwhile, the upper limit of the number of the first metal atoms comprised in the particles (A) is preferably 30, more preferably 10, and further more preferably 6. When the number of the first metal atoms comprised in the particles (A) falls within the above range, further improvements of the sensitivity and resolution of the radiation-sensitive composition are enabled.

In the case of the particles (A) comprising the ligand derived from the organic acid (a), the lower limit of the percentage content of the ligand derived from the organic acid (a) in the particles (A) is preferably 1% by mass, more preferably 20% by mass, further more preferably 40% by mass, and particularly preferably 60% by mass. Meanwhile, the upper limit of the percentage content of the ligand derived from the organic acid (a) is preferably 95% by mass, and more preferably 90% by mass. When the percentage content of the ligand derived from the organic acid (a) falls within the above range, it is possible to adjust solubility of the particles (A) in a developer solution to be more appropriate, whereby further improvements of the sensitivity and resolution of the radiation-sensitive composition are enabled. The particles (A) may include either only a single type, or two or more types, of the ligand derived from the organic acid (a).

The lower limit of the content of the particles (A) with respect to the total solid content in the composition is preferably 10% by mass, more preferably 50% by mass, further more preferably 70% by mass, and particularly preferably 85% by mass. Meanwhile, the upper limit of the content of the particles (A) with respect to the total solid content in the composition is preferably 99% by mass, and more preferably 95% by mass. When the content of the particles (A) falls within the above range, further improvements of the sensitivity and resolution of the radiation-sensitive composition are enabled. The radiation-sensitive composition may include either only a single type, or two or more types, of the particles (A). The "solid content" as referred to means a component obtained by removing the solvent (C) and an inorganic solvent (described later) from the radiation-sensitive composition.

Synthesis Procedure of (A) Particles

The particles (A) may be obtained by, for example, a procedure of carrying out a hydrolytic condensation reaction by using (b) a metal-containing compound (described later), a procedure of carrying out a ligand substitution reaction by using the metal-containing compound (b), and the like. The "hydrolytic condensation reaction" as referred to means a reaction in which a hydrolyzable group comprised in the metal-containing compound (b) is hydrolyzed to give —OH, and two —OHs thus obtained undergo dehydrative condensation to form —O—.

Metal-Containing Compound (b)

The metal-containing compound (b) is: a metal compound (I) comprising the first metal atom and a hydrolyzable group; a hydrolysis product of the metal compound (I) comprising the first metal atom and a hydrolyzable group; a hydrolytic condensation product of the metal compound (I) comprising the first metal atom and a hydrolyzable group; or a combination thereof. The metal compound (I) may be used either alone of one type, or in combination of two or more types thereof.

The hydrolyzable group is exemplified by a halogen atom, an alkoxy group, an acyloxy group, and the like.

Examples of the halogen atom include a fluorine atom, a chlorine atom, a bromine atom, an iodine atom, and the like.

Examples of the alkoxy group include a methoxy group, an ethoxy group, a n-propoxy group, an i-propoxybutoxy group, and the like.

Examples of the acyloxy group include an acetoxy group, an ethylyloxy group, a propionyloxy group, a butyryloxy group, a t-butyryloxy group, a t-amylyloxy group, a n-hexanecarbonyloxy group, a n-octanecarbonyloxy group, and the like.

As the hydrolyzable group, an alkoxy group and an acyloxy group are preferred, and an isopropoxy group and an acetoxy group are more preferred.

The metal compound (I) is exemplified by compounds represented by the following formula (1) (hereinafter, may be also referred to as a "metal compound (I-1)"), and the like. By using the metal compound (I-1), forming a stable metal oxide is enabled, whereby further improvements of the sensitivity and resolution of the radiation-sensitive composition are enabled.

$$L_a M Y_b \qquad (1)$$

In the above formula (1), M represents the first metal atom; L represents a ligand; a is an integer of 0 to 2, wherein in a case where a is 2, a plurality of Ls are identical or different; Y represents the hydrolyzable group selected from a halogen atom, an alkoxy group, and an acyloxy group; and b is an integer of 2 to 6, wherein a plurality of Ys may be identical or different, and L is a ligand that does not fall under the definition of Y.

As the first metal atom represented by M, a bismuth atom, a zinc atom, and a tellurium atom are preferred.

The ligand represented by L is exemplified by a monodentate ligand and a polydentate ligand.

Exemplary monodentate ligand includes a hydroxo ligand, a carboxy ligand, an amido ligand, an amine ligand, a nitro ligand, ammonia, and the like.

Examples of the amido ligand include an unsubstituted amido ligand ($NH_2$), a methylamido ligand (NHMe), a dimethylamido ligand ($NMe_2$), a diethylamido ligand ($NEt_2$), a dipropylamido ligand ($NPr_2$), and the like. Examples of the amine ligand include a trimethylamine ligand, a triethylamine ligand, and the like.

Exemplary polydentate ligand includes a hydroxy acid ester, a β-diketone, a β-keto ester, a β-dicarboxylic acid ester, a hydrocarbon having a π bond, a diphosphine, and the like.

Examples of the hydroxy acid ester include glycolic acid esters, lactic acid esters, 2-hydroxycyclohexane-1-carboxylic acid esters, salicylic acid esters, and the like.

Examples of the β-diketone include 2,4-pentanedione, 3-methyl-2,4-pentanedione, 3-ethyl-2,4-pentanedione, and the like.

Examples of the β-keto ester include acetoacetic acid esters, α-alkyl-substituted acetoacetic acid esters, β-ketopentanoic acid esters, benzoylacetic acid esters, 1,3-acetonedicarboxylic acid esters, and the like.

Examples of the β-dicarboxylic acid ester include malonic acid diesters, α-alkyl-substituted malonic acid diesters, α-cycloalkyl-substituted malonic acid diesters, α-aryl-substituted malonic acid diesters, and the like.

Examples of the hydrocarbon having a π bond include:
chain olefins such as ethylene and propylene;
cyclic olefins such as cyclopentene, cyclohexene and norbornene;
chain dienes such as butadiene and isoprene;
cyclic dienes such as cyclopentadiene, methylcyclopentadiene, pentamethylcyclopentadiene, cyclohexadiene and norbornadiene;
aromatic hydrocarbons such as benzene, toluene, xylene, hexamethylbenzene, naphthalene and indene; and the like.

Examples of the diphosphine includes 1,1-bis(diphenylphosphino)methane, 1,2-bis(diphenylphosphino)ethane, 1,3-bis(diphenylphosphino)propane, 2,2'-bis(diphenylphosphino)-1,1'-binaphthyl, 1,1'-bis(diphenylphosphino)ferrocene, and the like.

Examples and preferred examples of the halogen atom, the alkoxy group, and the acyloxy group which may be represented by Y may be similar to those exemplified in connection with the hydrolyzable group.

Preferably b is an integer of 2 to 4. When b is the above specified value, it is possible to increase the percentage content of the metal oxide in the particles (A), whereby more effective promotion of the generation of the secondary electrons by the particles (A) is enabled. Consequently, a further improvement of the sensitivity of the radiation-sensitive composition is enabled.

As the metal-containing compound (b), a metal alkoxide that is neither hydrolyzed nor hydrolytic condensed, and a metal acyloxide that is neither hydrolyzed nor hydrolytically condensed are preferred.

Examples of the metal-containing compound (b) include bismuth(III) isopropoxide, tellurium(IV) aisopropoxide, zinc(II) isopropoxide, zinc acetate dihydrate, germanium (IV) isopropoxide, boron(III) ethoxide, aluminum(III) isopropoxide, gallium(III) isopropoxide, thallium(I) ethoxide, antimony(III) ethoxide, antimony(III) isopropoxide, and the like. Of these, compounds comprising at least one of zinc and antimony are preferred; and zinc acetate dihydrate and antimony(III) isopropoxide are more preferred, as the metal-containing compound (b).

A procedure for carrying out the hydrolytic condensation reaction using the metal-containing compound (b) may be exemplified by: a procedure of hydrolytically condensing the metal-containing compound (b) in a solvent containing water; and the like. In this case, other compound having a hydrolyzable group may be added as needed. The lower limit of the amount of water used for the hydrolytic condensation reaction is preferably 0.2 times molar amount, more preferably an equimolar amount, and further more preferably 3 times molar amount with respect to the hydrolyzable group comprised in the metal-containing compound (b) and the like. The upper limit of the amount of water is preferably 20 times molar amount, more preferably 15 times molar amount, and further more preferably 10 times molar amount. When the amount of the water in the hydrolytic condensation reaction falls within the above range, it is possible to increase the percentage content of the metal oxide in the particles (A) to be obtained, whereby further improvements of the sensitivity and resolution of the radiation-sensitive composition are enabled. It is to be noted that, the hydrolytic condensation reaction may proceed even with a small amount of water having been inevitably contaminated into in the solvent, and it is therefore not necessarily required to especially add water into the solvent.

A procedure for carrying out the ligand substitution reaction using the metal-containing compound (b) may be exemplified by: a procedure of mixing the metal-containing compound (b) and the organic acid (a); and the like. In this case, mixing of the metal-containing compound and the organic acid (a) may be performed either in a solvent or without a solvent. Upon the mixing, a base such as triethylamine may be added as needed. An amount of the base added is, for example, no less than 1 part by mass and no greater than 200 parts by mass with respect to 100 parts by mass of a total amount of the metal-containing compound (b) and the organic acid (a) used.

In the case of using an organic acid for synthesizing the particles (A), the lower limit of the amount of the organic acid used is preferably 10 parts by mass, and more preferably 30 parts by mass, with respect to 100 parts by mass of the metal-containing compound (b). Meanwhile, the upper limit of the amount of the organic acid used is preferably 2,000 parts by mass, more preferably 1,000 parts by mass, further more preferably 700 parts by mass, and particularly preferably 100 parts by mass, with respect to 100 parts by mass of the metal-containing compound (b). When the amount of the organic acid used falls within the above range, it is possible to appropriately adjust a percentage content of the ligand derived from the organic acid (a) in the particles (A) to be obtained, whereby further improvements of the sensitivity and resolution of the radiation-sensitive composition are enabled.

Upon the synthesis reaction of the particles (A), in addition to the metal compound (I) and the organic acid (a), a compound that may be the polydentate ligand represented by L in the compound of the formula (1), a compound that may be a bridging ligand, etc., may also be added. Examples of the compound that may be a bridging ligand include: compounds having two or more coordinating groups such as a hydroxy group, an isocyanate group, an amino group, an ester group, an amide group, etc.; and the like.

The solvent for use in the synthesis reaction of the particles (A) is not particularly limited, and solvents similar to those exemplified in connection with the solvent (C) described later may be used. Of these, alcohol solvents, ether solvents, ester solvents, and hydrocarbon solvents are preferred; ether solvents and ester solvents are more preferred; cyclic ether solvents and monocarboxylic acid ester solvents are further more preferred; and tetrahydrofuran and ethyl acetate are particularly preferred.

In the case of using the solvent in the synthesis reaction of the particles (A), the solvent used may be either removed after the completion of the reaction, or directly used as the solvent (C) in the radiation-sensitive composition without removal thereof.

The lower limit of the temperature of the synthesis reaction of the particles (A) is preferably 0° C., and more preferably 10° C. The upper limit of the temperature is preferably 150° C., and more preferably 100° C.

The lower limit of the time period of the synthesis reaction of the particles (A) is preferably 1 min, more preferably 10 min, and further more preferably 1 hour. The upper limit of the time period is preferably 100 hrs, more preferably 50 hrs, and further more preferably 24 hrs.

(B) Acid Generator

The acid generator (B) to be used in the radiation-sensitive composition is a component that generates an acid having a van der Waals volume of no less than $2.0 \times 10^{-28}$ m$^3$ upon irradiation with a radioactive ray. The acid generator (B) may be contained in the radiation-sensitive composition in the form of a low molecular weight compound (hereinafter, may be also referred to as "(B) acid generating agent" as appropriate), or in the form incorporated as a part of a polymer, or in both of these forms; however, it is preferred that only the acid generating agent (B) is contained, in light of etching resistance.

The lower limit of the van der Waals volume of the acid generated from the acid generator (B) is preferably $3.0 \times 10^{-28}$ m$^3$. Meanwhile, the upper limit of the van der Waals volume of the acid generated from the acid generator (B) is preferably $8.0 \times 10^{-28}$ m$^3$, and more preferably $6.0 \times 10^{-28}$ m$^3$. When the van der Waals volume of the acid falls within the above range, further improvements of the sensitivity and resolution of the radiation-sensitive composition are enabled. The term "van der Waals volume" as referred to means a volume occupied by a van der Waals sphere on the basis of a van der Waals radius of the atoms constituting the acid, the volume being calculated by obtaining a stable structure in accordance with the PM3 method using molecular orbital calculation software.

The acid generating agent (B) is exemplified by an onium salt compound, a N-sulfonyloxyimide compound, a halogen-containing compound, a diazo ketone compound, and the like.

Exemplary onium salt compound includes a sulfonium salt, a tetrahydrothiophenium salts, an iodonium salt, a phosphonium salt, a diazonium salt, a pyridinium salt, and the like.

Examples of the sulfonium salt include triphenylsulfonium perfluoro-n-octanesulfonate, triphenylsulfonium 2-bicyclo[2.2.1]hept-2-yl-1,1,2,2,-tetrafluoroethanesulfonate, triphenylsulfonium camphorsulfonate, triphenylsulfonium 6-(adamantane-1-ylcarbonyloxy)-1,1,2,2-tetrafluoro-hexane-1-sulfonate, triphenylsulfonium 2-(1-adamantyl)-1, 1-difluoroethanesulfonate, triphenylsulfonium 2-(adamantane-1-ylcarbonyloxy)-1,1,3,3,3-pentafluoropropane-1-sulfonate, triphenylsulfonium 2-(4-oxoadamantane-1-ylcarbonyloxy)-1,1,3,3,3-pentafluoropropane-1-silfonate, triphenylsulfonium 1,2-di(cyclohexyloxycarbonyl)ethane-1-sulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, 4-cyclohexylsulfonylphenyldiphenylsulfonium 5,6-di(cyclohexyloxycarbonyl)norbornane-2-sulfonate, and the like.

Examples of the tetrahydrothiophenium salt include 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulphonate, 1-(4-n-butoxynaphthalen-1-yl)tetrahydrothiophenium hexafluoropropylene sulfonimide, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulphonate, 1-(6-n-butoxynaphthalen-2-yl)tetrahydrothiophenium hexafluoropropylene sulfonimide, 1-(3,5-dimethyl-4-hydroxyphenyl)tetrahydrothiophenium perfluoro-n-octanesulfonate, 1-(3,5-dimethyl-4-hydroxyphenyl) tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, 1-(3,5-dimethyl-4-hydroxyphenyl)tetrahydrothiophenium tetrahydrothiophenium hexafluoro propylene sulfonimide, and the like.

Examples of the iodonium salt include diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butanesulfonyloxy) bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$,1$^{7,10}$] dodecanyl)-1,1-difluoroethanesulfonyloxy)bicyclo[2.2.1]hept-5-ene-2,3-dicarboxyimide, N-(camphorsulfonyloxy) bicyclo[2.2.1]hept-5-ene-2,3-dicarboxyimide, and the like.

As the acid generating agent (B), an onium salt compound is preferred, a sulfonium salt is more preferred, and triphenylsulfonium 6-(adamantane-1-ylcarbonyloxy)-1,1,2,2-tetrafluorohexane-1-sulfonate and 4-cyclohexylsulfonylphenyldiphenylsulfonium 5,6-di(cyclohexyloxycarbonyl)norbornane-2-sulfonate are particularly preferred.

In the case in which the radiation-sensitive composition contains the acid generating agent (B) as the acid generator (B), the lower limit of the content of the acid generating agent (B) with respect to the total solid content in the composition is preferably 1% by mass, more preferably 2% by mass, and further more preferably 3% by mass. Meanwhile, the upper limit of the content of the acid generating agent (B) with respect to the total solid content in the composition is preferably 40% by mass, more preferably 30% by mass, and further more preferably 20% by mass. When the content of the acid generating agent (B) falls within the above range, further improvements of the sensitivity and resolution of the radiation-sensitive composition are enabled. The radiation-sensitive composition may include either only a single type, or two or more types, of the acid generating agent (B).

(C) Solvent

The solvent (C) used in the radiation-sensitive composition is not particularly limited as long as it is a solvent capable of dissolving or dispersing at least the particles (A), the acid generator (B), as well as optional component(s) comprised as needed. The solvent used in the synthesis of the particles (A) may also be directly used as the solvent (C). The radiation-sensitive composition may include either only a single type, or two or more types, of the solvent (C). It is to be noted that although the radiation-sensitive composition may further comprise an inorganic solvent such as water in addition to the solvent (C), it is preferred that the inorganic solvent is not contained as a principal solvent, in light of applicability to a substrate, solubility of the particles (A) in a developer solution, storage stability, etc. The upper limit of the content of the inorganic solvent in the radiation-sensitive composition is preferably 20 parts by mass, and more preferably 10 parts by mass.

The solvent (C) is exemplified by an alcohol solvent, an ether solvent, a ketone solvent, an amide solvent, an ester solvent, a hydrocarbon solvent, and the like.

Examples of the alcohol solvent include:

aliphatic monohydric alcohol solvents having 1 to 18 carbon atoms such as ethanol, 2-propanol, 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partial ether solvents having 3 to 19 carbon atoms such as propylene glycol monomethyl ether and propylene glycol monoethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as ethyl acetate, n-butyl acetate and ethyl lactate;

polyhydric alcohol carboxylate solvents such as propylene glycol acetate;

polyhydric alcohol partial ether carboxylate solvents such as propylene glycol monomethyl ether acetate and propylene glycol monoethyl ether acetate;

polyhydric carboxylic acid diester solvents such as diethyl oxalate;

lactone solvents such as γ-butyrolactone and δ-valerolactone;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

alicyclic hydrocarbon solvents having 5 to 12 ring atoms such as decahydronaphthalene;

aromatic hydrocarbon solvents having 6 to 16 carbon atoms such as toluene and xylene; and the like.

As the solvent (C), an alcohol solvent and an ester solvent are preferred; a polyhydric alcohol partial ether solvent and a polyhydric alcohol partial ether carboxylate solvent are preferred; and propylene glycol monoethyl ether and propylene glycol monomethyl ether acetate are further more preferred.

Other Optional Component

The radiation-sensitive composition may also comprise, in addition to the components (A) to (C), optional components such as a compound that may be a ligand, a surfactant, and the like.

Compound that May be Ligand

The compound that may be a ligand to be used in the radiation-sensitive composition is exemplified by a compound that may be a polydentate ligand or a bridging ligand (hereinafter, may be also referred to as "compound (II)") and the like. Examples of the compound (II) include compounds similar to those exemplified as the compounds that may be added upon the hydrolytic condensation reaction in the synthesis procedure of the particles (A), and the like.

In the case in which the radiation-sensitive composition contains the compound (II), the upper limit of the content of the compound (II) with respect to the total solid content in the radiation-sensitive composition is preferably 10% by mass, more preferably 3% by mass, and further more preferably 1% by mass.

Surfactant

The surfactant which may be used in the radiation-sensitive composition is a component that exhibits the effect of improving coating properties, striation and the like. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate; and the like. Examples of a commercially available product of the surfactant include KP341 (manufactured by Shin-Etsu Chemical Co., Ltd.), Polyflow No. 75 and Polyflow No. 95 (each manufactured by Kyoeisha Chemical Co., Ltd.), EFTOP EF301, EFTOP EF303 and EFTOP EF352 (each manufactured by Tochem Products Co. Ltd.), Megaface F171 and Megaface F173 (each manufactured by DIC Corporation), Fluorad FC430 and Fluorad FC431 (each manufactured by Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (each manufactured by Asahi Glass Co., Ltd.), and the like.

Preparation Method of Radiation-Sensitive Composition

The radiation-sensitive composition may be prepared, for example, by mixing the particles (A), the acid generator (B) and the solvent (C), as well as the other optional component that may be added as needed, at a certain ratio, preferably followed by filtering a mixture thus obtained through a membrane filter having a pore size of approximately 0.2 μm. The lower limit of the solid content concentration of the radiation-sensitive composition is preferably 0.1% by mass, more preferably 0.5% by mass, still more preferably 1% by mass, and particularly preferably 3% by mass. The upper limit of the solid content concentration is preferably 50% by mass, more preferably 30% by mass, still more preferably 15% by mass, and particularly preferably 7% by mass.

Pattern-Forming Method

The pattern-forming method comprises: applying the radiation-sensitive composition on one face side of a substrate (hereinafter, may be also referred to as "applying step"); exposing a film obtained by the applying (hereinafter, may be also referred to as "exposing step"); and developing the film exposed (hereinafter, may be also referred to as "developing step"). The radiation-sensitive composition described above is employed in the pattern-forming method, and therefore the method is able to form with high sensitivity a pattern superior in resolution. Hereinafter, each step is explained.

Applying Step

In this step, the radiation-sensitive composition is applied on one face side of a substrate to form a film. Specifically, the film is formed by applying the radiation-sensitive composition such that the resulting film has a desired thickness, followed by prebaking (PB) to volatilize the solvent and the like in the radiation-sensitive composition as needed. A procedure for applying the radiation-sensitive composition is not particularly limited, and an appropriate application procedure such as spin-coating, cast coating, roller coating, etc. may be employed. Examples of the substrate include a silicon wafer, a wafer coated with aluminum, and the like. It is to be noted that an organic or inorganic antireflective film may also be formed on the substrate in order to maximize potential of the radiation-sensitive composition.

The lower limit of an average thickness of the film to be formed in the present step is preferably 1 nm, more preferably 5 nm, further more preferably 10 nm, and particularly preferably 20 nm. Meanwhile, the upper limit of the average thickness is preferably 1,000 nm, more preferably 200 nm, further more preferably 100 nm, and particularly preferably 70 nm.

The lower limit of the temperature for the PB is generally 25° C., preferably 40° C., more preferably 60° C., and further more preferably 80° C. The upper limit of the temperature for the PB is generally 160° C., preferably 140° C., and more preferably 120° C. The lower limit of the time period for the PB is generally 5 sec, and preferably 10 sec. The upper limit of the time period for the PB is generally 600 sec, and preferably 300 sec.

In this step, in order to inhibit an influence of basic impurities, etc., in the environmental atmosphere, for example, a protective film may be provided on the film formed. Furthermore, in the case of conducting liquid immersion lithography in the exposing step as described later, in order to avoid a direct contact between a liquid immersion medium and the film, a protective film for liquid immersion may also be provided on the film formed.

Exposure Step

In this step, the film obtained by the applying is exposed. Specifically, for example, the film is irradiated with a radioactive ray through a mask having a predetermined pattern. In this step, irradiation with a radioactive ray through a liquid immersion medium such as water, i.e., liquid immersion lithography, may be employed as needed. Examples of the radioactive ray for the exposure include: electromagnetic waves such as visible light rays, ultraviolet rays, far ultraviolet rays, extreme ultraviolet rays (EUV, wavelength: 13.5 nm), X-rays and γ radiations; charged particle rays such as electron beams and α-rays; and the like. Of these, EUV and electron beams are preferred in light of increasing the secondary electrons generated from the particles (A) having absorbed the radioactive ray.

It is preferred that the exposure is followed by post exposure baking (PEB), whereby the structural change of the particles (A), due to the acid generated by the acid generator (B) upon the exposure, is promoted in the light-exposed regions of the film. The PEB enables a difference of solubility in a developer solution to be increased between the light-exposed regions and the light-unexposed regions of the film. The lower limit of the temperature for the PEB is preferably 50☐, and more preferably 70☐. Meanwhile, the upper limit of the temperature for the PEB is preferably 180° C., and more preferably 130° C. The lower limit of the time period for the PEB is preferably 5 sec, and more preferably 10 sec. The upper limit of the time period for the PEB is preferably 600 sec, and more preferably 300 sec.

Development Step

In this step, the exposed film is developed by using a developer solution. A predetermined pattern is thereby formed. Examples of the developer solution include an alkaline aqueous solution, an organic solvent-containing liquid, and the like. In the case of using the alkaline aqueous solution as the developer solution, in general, a positive type pattern can be obtained. On the other hand, in the case of using the organic solvent-containing liquid as the developer solution, in general, a negative type pattern can be obtained. As the developer solution, the organic solvent-containing liquid is preferred in light of developability and the like.

Examples of the alkaline aqueous solution include: alkaline aqueous solutions prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide (TMAH), pyrrole, piperidine, choline, 1,8-diazabicyclo-[5.4.0]-7-undecene and 1,5-diazabicyclo-[4.3.0]-5-nonene; and the like.

The lower limit of a content of the alkaline compound in the alkaline aqueous solution is preferably 0.1% by mass, more preferably 0.5% by mass, and further more preferably 1% by mass. The upper limit of the alkaline compound is preferably 20 parts by mass, more preferably 10 parts by mass, and further more preferably 5 parts by mass.

As the alkaline aqueous solution, an aqueous TMAH solution is preferred, and a 2.38% by mass aqueous TMAH solution is more preferred.

Examples of an organic solvent in the organic solvent-containing liquid include organic solvents similar to those exemplified in connection with the solvent (C) in the radiation-sensitive composition, and the like. Of these, a hydrocarbon solvent is preferred; an aliphatic hydrocarbon solvent, an alicyclic hydrocarbon solvent, and an aromatic hydrocarbon solvent are more preferred; hexane, decahydronaphthalene, and toluene are further more preferred; and a mixed solvent of hexane and toluene is particularly preferred.

The lower limit of a content of the organic solvent in the organic solvent-containing liquid is preferably 80% by mass, more preferably 90% by mass, further more preferably 95% by mass, and particularly preferably 99% by mass. When the content of the organic solvent falls within the above range, a further improvement of a contrast of the rate of dissolution in the developer solution between the light-exposed regions and the light-unexposed regions is enabled. Examples of components other than the organic solvent in the organic solvent-containing liquid include water, silicone oil, and the like.

An appropriate amount of a surfactant may be added to the developer solution as needed. As the surfactant, for example, an ionic or nonionic fluorochemical surfactant, a silicone surfactant, and the like may be used.

Examples of the development procedure include: a dipping procedure in which the substrate is immersed for a given time period in the developer solution charged in a container; a puddle procedure in which the developer solution is placed to form a dome-shaped bead by way of the surface tension on the surface of the substrate for a given time period to conduct a development; a spraying procedure in which the developer solution is sprayed onto the surface of the substrate; a dynamic dispensing procedure in which the developer solution is continuously applied onto the substrate that is rotated at a constant speed while scanning with a developer solution-application nozzle at a constant speed; and the like.

It is preferred that, following the development, the substrate is rinsed by using a rinse agent such as water, alcohol, etc., and then dried. A procedure for the rinsing is exemplified by a procedure of continuously applying the rinse agent onto the substrate that is rotated at a constant speed (spin-coating procedure), a procedure of immersing the substrate for a given time period in the rinse agent charged in a container (dipping procedure), a procedure of spraying the rinse agent onto the surface of the substrate (spraying procedure), and the like.

EXAMPLES

Hereinafter, the present invention is explained in detail by way of Examples, but the present invention is limited to these Examples. Measuring methods for physical properties in connection with the Examples are shown below.

Average Particle Diameter

The average particle diameter of the particles (A) was measured by a DLS method using a light scattering measurement device ("Zetasizer Nano ZS" available from Malvern Instruments Ltd.).

Van Der Waals Volume

The van der Waals volume was calculated by obtaining a stable structure in accordance with the PM3 method using WinMOPAC (Ver. 3.9.0, available from Fujitsu Limited).

(A) Particles

The organic acids (a) and the metal-containing compounds (b) used for synthesis of the particles (A) are shown below.

Organic Acid (a)
- a-1: methacrylic acid (pKa: 4.66)
- a-2: tiglic acid (pKa: 4.96)
- a-3: benzoic acid (pKa: 4.21)

Metal-Containing Compound (b)
- b-1: zinc acetate dihydrate
- b-2: zinc(I) isopropoxide
- b-3: antimony(III) isopropoxide
- b-4: tetraethoxysilane
- b-5: zirconium(IV) isopropoxide
- b-6: hafnium(IV) isopropoxide
- b-7: boron(III) ethoxide
- b-8: aluminum(III) isopropoxide
- b-9: gallium(III) isopropoxide
- b-10: thallium(I) ethoxide
- b-11: germanium(IV) isopropoxide
- b-12: bismuth(III) isopropoxide
- b-13: tellurium(IV) isopropoxide Synthesis Example 1

1.9 g of the compound (a-1) and 1.7 g of the compound (b-1) were dissolved in 40.0 g of ethyl acetate. 2.2 ml of triethylamine was added dropwise to a solution thus obtained, and then heated at 65° C. for 2 hrs. The reaction solution was washed with hexane and then dried to give particles (A-1) comprising principally: the metal atoms; and the ligand derived from the organic acid. The average particle diameter of the particles (A-1) was 1.6 nm.

Synthesis Example 2

1.9 g of the compound (a-3) and 1.7 g of the compound (b-1) were dissolved in 40.0 g of ethyl acetate. 2.2 ml of triethylamine was added dropwise to a solution thus obtained, and then heated at 65° C. for 2 hrs. The reaction solution was washed with hexane and then dried to give particles (A-2) comprising principally: the metal atoms; and the ligand derived from the organic acid. The average particle diameter of the particles (A-2) was 1.8 nm.

Synthesis Example 3

2.0 g of the compound (a-2) and 1.5 g of the compound (b-2) were dissolved in 15 ml of tetrahydrofuran. The resulting solution was heated at 65° C. for 21 hrs. The reaction solution was washed with hexane and then dried to give particles (A-3) comprising principally: the metal atoms; and the ligand derived from the organic acid. The average particle diameter of the particles (A-3) was 1.7 nm.

Synthesis Example 4

8.0 g of the compound (a-1) and 1.5 g of the compound (b-3) were mixed and then heated at 65° C. for 21 hrs. The reaction solution was washed with ultra pure water and acetone and then dried to give particles (A-4) comprising principally: the metal atoms; and the ligand derived from the organic acid. The average particle diameter of the particles (A-4) was 2.0 nm.

Synthesis Example 5

1.9 g of the compound (a-3), 0.5 g of the compound (b-1), and 1.2 g of the compound (b-4) were dissolved in 40.0 g of ethyl acetate. 2.2 ml of triethylamine was added dropwise to a solution thus obtained, and then heated at 65° C. for 8 hrs. The reaction solution was washed with hexane and then dried to give particles (A-5) comprising principally: the metal atoms; and the ligand derived from the organic acid. The average particle diameter of the particles (A-5) was 2.3 nm.

Synthesis Example 6

2.0 g of the compound (a-3) and 1.7 g of the compound (b-5) were dissolved in 15 ml of tetrahydrofuran. The resulting solution was heated at 65° C. for 4 hrs. The reaction solution was washed with ultra pure water and then dried to give particles (A-6) comprising principally: the metal atoms; and the ligand derived from the organic acid. The average particle diameter of the particles (A-6) was 2.1 nm.

Synthesis Example 7

8.0 g of the compound (a-1) and 1.5 g of the compound (b-6) were mixed and then heated at 65° C. for 18 hrs. The reaction solution was washed with ultra pure water and then dried to give particles (A-7) comprising principally: the metal atoms; and the ligand derived from the organic acid. The average particle diameter of the particles (A-7) was 2.1 nm.

Synthesis Example 8

2.0 g of the compound (a-2) and 1.5 g of the compound (b-7) were dissolved in 15 ml of tetrahydrofuran. The resulting solution was heated at 65° C. for 8 hrs. The reaction solution was washed with hexane and then dried to give particles (A-8) comprising principally: the metal atoms; and the ligand derived from the organic acid. The average particle diameter of the particles (A-8) was 2.1 nm.

Synthesis Example 9

8.0 g of the compound (a-1) and 1.5 g of the compound (b-8) were mixed and then heated at 65° C. for 12 hrs. The reaction solution was washed with ultra pure water and then dried to give particles (A-9) comprising principally: the metal atoms; and the ligand derived from the organic acid. The average particle diameter of the particles (A-9) was 2.4 nm.

Synthesis Example 10

1.5 g of the compound (a-3) and 1.5 g of the compound (b-9) were dissolved in 15 ml of tetrahydrofuran. The resulting solution was heated at 65° C. for 8 hrs. The reaction solution was washed with hexane and then dried to give particles (A-10) comprising principally: the metal atoms; and the ligand derived from the organic acid. The average particle diameter of the particles (A-10) was 2.2 nm.

Synthesis Example 11

8.0 g of the compound (a-1) and 1.5 g of the compound (b-10) were mixed and then heated at 65° C. for 10 hrs. The reaction solution was washed with ultra pure water and then dried to give particles (A-11) comprising principally: the metal atoms; and the ligand derived from the organic acid. The average particle diameter of the particles (A-11) was 2.1 nm.

Synthesis Example 12

2.5 g of the compound (a-3) and 1.5 g of the compound (b-11) were dissolved in 15 ml of tetrahydrofuran. The resulting solution was heated at 65° C. for 18 hrs. The reaction solution was washed with hexane and then dried to give particles (A-12) comprising principally: the metal atoms; and the ligand derived from the organic acid. The average particle diameter of the particles (A-12) was 2.3 nm.

Synthesis Example 13

2.0 g of the compound (a-2) and 1.5 g of the compound (b-12) were dissolved in 20 ml of tetrahydrofuran. The resulting solution was heated at 65° C. for 12 hrs. The reaction solution was washed with hexane and then dried to give particles (A-13) comprising principally: the metal atoms; and the ligand derived from the organic acid. The average particle diameter of the particles (A-13) was 2.4 nm.

Synthesis Example 14

8.0 g of the compound (a-1) and 1.5 g of the compound (b-13) were mixed and then heated at 65° C. for 10 hrs. The reaction solution was washed with ultra pure water and then dried to give particles (A-14) comprising principally: the metal atoms; and the ligand derived from the organic acid. The average particle diameter of the particles (A-14) was 2.0 nm.

Synthesis Example 15

1.7 g of the compound (b-1) was dissolved in 20.0 g of ethyl acetate. 2.2 ml of triethylamine was added dropwise to a solution thus obtained, and then heated at 65° C. for 2 hrs. The reaction solution was washed with hexane and then dried to give particles (A-15) comprising principally: the metal atoms; and oxygen atoms. The average particle diameter of the particles (A-15) was 2.8 nm.

Preparation of Radiation-Sensitive Composition

The acid generating agent (B) and the solvent (C) which were used in the preparation of the radiation-sensitive resin composition are shown below.

(B) Acid Generating Agent

B-1: N-(trifluoromethylsulfonyloxy)-1,8-naphthalimide (van der Waals volume of generated acid: $0.84 \times 10^{-28}$ m$^3$)

B-2: triphenylsulfonium trifluoromethanesulfonate (van der Waals volume of generated acid: $0.84 \times 10^{-28}$ m$^3$)

B-3: 4-cyclohexylsulfonylphenyldiphenylsulfonium 5,6-di(cyclohexyloxycarbonyl)norbornane-2-sulfonate (van der Waals volume of generated acid: $3.80 \times 10^{-28}$ m$^3$)

B-4: triphenylsulfonium 6-(adamantane-1-ylcarbonyloxy)-1,1,2,2-tetrafluorohexane-1-sulfonate (van der Waals volume of generated acid: $3.34 \times 10^{-28}$ m$^3$)

(C) Solvent

C-1: propylene glycol monomethyl ether acetate

C-2: propylene glycol monoethyl ether

Comparative Example 1

100 parts by mass of the particles (A-1) as the particles (A), 5 parts by mass of (B-1) as the acid generating agent (B), and 5 parts by mass of (C-1) as the solvent (C) were mixed to give a mixed liquid having a solid content concentration of 5% by mass. The mixed liquid thus obtained was filtered through a membrane filter having a pore size of 0.20 μm, to thereby prepare a radiation-sensitive composition (R-1).

Comparative Examples 2 to 10 and Examples 1 to 13

Respective radiation-sensitive compositions were prepared by a similar operation to that of Comparative Example 1 except that the type and the content of each component used were as shown in Table 1 below.

A percentage content of the first metal atom with respect to total metal atoms in the radiation-sensitive compositions (R-1) to (R-4) and (R-8) to (R-23) is 100 atomic %. A percentage content of the first metal atom in the radiation-sensitive composition (R-5) is 16 atomic %. A percentage content of the first metal atom in the radiation-sensitive compositions (R-6) and (R-7) is 0 atomic %. It is to be noted that the percentage content of the first metal atom is an estimated value based on a hypothesis that: the metal atoms comprised in each of the radiation sensitive compositions are all derived from the particles (A); and upon synthesis of the particles (A), each identical type of metal atoms comprised in the metal-containing compound (b) has been incorporated at a given ratio. Specifically, the percentage content of the first metal atom is a value obtained by a formula of: $100 \times R_a/R_A$, wherein $R_A$ is the number of all the metal atoms comprised in the metal-containing compound (b) used for synthesis of the particles (A), and $R_B$ is the number of the first metal atoms comprised in the metal-containing compound (b).

TABLE 1

| | Radiation-sensitive composition | (A) Particles Type | (A) Particles Content (parts by mass) | (B) Acid generating agent Type | (B) Acid generating agent Content (parts by mass) | (C) Solvent Type |
|---|---|---|---|---|---|---|
| Comparative Example 1 | R-1 | A-1 | 100 | B-1 | 5 | C-1 |
| Comparative Example 2 | R-2 | A-2 | 100 | B-1 | 10 | C-1/C-2* |
| Comparative Example 3 | R-3 | A-3 | 100 | B-1 | 5 | C-1 |
| Comparative Example 4 | R-4 | A-4 | 100 | B-2 | 10 | C-1 |
| Comparative Example 5 | R-5 | A-5 | 100 | B-2 | 5 | C-1 |

TABLE 1-continued

| | Radiation-sensitive composition | (A) Particles Type | Content (parts by mass) | (B) Acid generating agent Type | Content (parts by mass) | (C) Solvent Type |
|---|---|---|---|---|---|---|
| Comparative Example 6 | R-6 | A-6 | 100 | B-3 | 5 | C-1 |
| Comparative Example 7 | R-7 | A-7 | 100 | B-4 | 5 | C-2 |
| Comparative Example 8 | R-8 | A-1 | 100 | — | — | C-1 |
| Comparative Example 9 | R-9 | A-2 | 100 | — | — | C-1/C-2* |
| Comparative Example 10 | R-10 | A-3 | 100 | — | — | C-1 |
| Example 1 | R-11 | A-1 | 100 | B-3 | 5 | C-1 |
| Example 2 | R-12 | A-1 | 100 | B-4 | 5 | C-1 |
| Example 3 | R-13 | A-2 | 100 | B-4 | 10 | C-1/C-2* |
| Example 4 | R-14 | A-3 | 100 | B-3 | 10 | C-1 |
| Example 5 | R-15 | A-4 | 100 | B-3 | 5 | C-1 |
| Example 6 | R-16 | A-8 | 100 | B-4 | 5 | C-1 |
| Example 7 | R-17 | A-9 | 100 | B-3 | 5 | C-1 |
| Example 8 | R-18 | A-10 | 100 | B-4 | 5 | C-2 |
| Example 9 | R-19 | A-11 | 100 | B-3 | 5 | C-1/C-2* |
| Example 10 | R-20 | A-12 | 100 | B-4 | 8 | C-1 |
| Example 11 | R-21 | A-13 | 100 | B-3 | 8 | C-1 |
| Example 12 | R-22 | A-14 | 100 | B-4 | 10 | C-1 |
| Example 13 | R-23 | A-15 | 100 | B-4 | 10 | C-1 |

*Mass ratio of C-1 to C-2 is 1:1

Pattern Formation

Comparative Example 1

The radiation-sensitive composition (R-1) prepared as described above was spin-coated onto a silicon wafer by a simplified spin coater, and then subjected to PB at 100° C. for 60 sec to form a film having an average thickness of 50 nm. Next, the film was irradiated with an electron beam using an electron beam writer ("JBX-9500FS" available from JEOL Ltd.) to permit patterning. After the irradiation with the electron beam, the film was subjected to PEB at 100° C. for 60 sec, and to a development carried out with an organic solvent (a mixed solvent of toluene and hexane in a volume ratio of 1:1), followed by drying, whereby a negative type pattern was formed.

Comparative Examples 2 to 10 and Examples 1 to 13

Patterns were formed by using respective radiation-sensitive compositions by a similar operation to that of Comparative Example 1 except that the processes used were as shown in Table 2 below. The symbol "-" in Table 2 indicates that the corresponding process was not used.
Evaluations
The patterns thus formed were evaluated for the sensitivity and limit resolution by the method described below. The results are shown in Table 2.
Sensitivity
An exposure dose, at which a line and space pattern (1L 1S) configured with line parts having a line width of 100 nm and space parts of 100 nm formed by neighboring line parts was formed to give a line width of 1:1, was defined as an "optimal exposure dose", and the "optimal exposure dose" was defined as "sensitivity" ($\mu C/cm^2$). The smaller value indicates superior sensitivity; and the sensitivity of no greater than 60 $\mu C/cm^2$ may be evaluated to be favorable, and the sensitivity of greater than 60 $\mu C/cm^2$ may be evaluated to be unfavorable.
Limit Resolution
Line and space patterns (1L 1S) were formed to have various line widths, and a half-pitch of the pattern in which a total of the line widths and the space widths was the smallest among the line and space patterns having the line width of 1:1 being maintained was defined as a limit resolution (nm). The smaller value indicates superior limit resolution; and the resolution of no greater than 50 nm may be evaluated to be favorable, and the limit resolution of greater than 50 nm may be evaluated to be unfavorable.

TABLE 2

| | Radiation-sensitive composition | PB (° C.) | PEB temperature (° C.) | Sensitivity ($\mu C/cm^2$) | Limit resolution (nm) |
|---|---|---|---|---|---|
| Comparative Example 1 | R-1 | 100 | 100 | 55 | 55 |
| Comparative Example 2 | R-2 | 100 | — | 55 | 55 |
| Comparative Example 3 | R-3 | 100 | — | 55 | 60 |
| Comparative Example 4 | R-4 | 100 | 100 | 55 | 60 |
| Comparative Example 5 | R-5 | 100 | — | 70 | 70 |
| Comparative Example 6 | R-6 | 100 | — | 60 | 65 |
| Comparative Example 7 | R-7 | 100 | 100 | 65 | 65 |
| Comparative Example 8 | R-8 | 100 | — | 60 | 60 |
| Comparative Example 9 | R-9 | 100 | 100 | 65 | 60 |
| Comparative Example 10 | R-10 | 100 | — | 65 | 65 |
| Example 1 | R-11 | 100 | 100 | 50 | 35 |
| Example 2 | R-12 | 100 | 100 | 55 | 40 |
| Example 3 | R-13 | 100 | 100 | 55 | 45 |
| Example 4 | R-14 | 100 | — | 55 | 45 |
| Example 5 | R-15 | 100 | — | 55 | 50 |
| Example 6 | R-16 | 100 | 100 | 50 | 40 |
| Example 7 | R-17 | 100 | 100 | 55 | 50 |
| Example 8 | R-18 | 100 | 100 | 50 | 40 |
| Example 9 | R-19 | 100 | — | 50 | 45 |
| Example 10 | R-20 | 100 | — | 45 | 40 |
| Example 11 | R-21 | 100 | — | 50 | 45 |
| Example 12 | R-22 | 100 | — | 50 | 40 |
| Example 13 | R-23 | 100 | — | 50 | 50 |

From the results shown in Table 2, it was confirmed that by using an acid generator that generates an acid having a van der Waals volume of no less than $2.0 \times 10^{-28}$ $m^3$, in combination with the particles that comprise as a principal component a metal oxide comprising the first metal atom, formation of a fine pattern was enabled with superior sensitivity and resolution. It is to be noted that an exposure to an electron beam is generally known to give a tendency similar to that in the case of the exposure to EUV. Therefore, the radiation-sensitive composition of the embodiments of the present invention is expected to be superior in sensitivity and resolution also in the case of an exposure to EUV.

The radiation-sensitive composition and the pattern-forming method according to the embodiments of the present invention enable a pattern superior in resolution to be formed with high sensitivity. Therefore, these can be suitably used for a processing process of semiconductor devices, and the like, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive composition comprising:
   particles comprising a metal oxide as a principal component;
   a radiation-sensitive acid generator; and
   an organic solvent,
   wherein:
   the metal oxide comprises at least one metal atom selected from the group consisting of a zinc atom, a boron atom, an aluminum atom, a gallium atom, a thallium atom, a germanium atom, an antimony atom, a bismuth atom, and a tellurium atom;
   the number of the at least one metal atom in the particles is from 2 to 6;
   a van der Waals volume of an acid generated from the radiation-sensitive acid generator is no less than $2.0 \times 10^{-28}$ m$^3$; and
   a percentage content of the at least one metal atom with respect to total metal atoms in the radiation-sensitive composition is no less than 50 atomic %.

2. The radiation-sensitive composition according to claim 1, wherein a content of the radiation-sensitive acid generator with respect to a total solid content in the radiation-sensitive composition is no less than 1% by mass and no greater than 40% by mass.

3. The radiation-sensitive composition according to claim 2, wherein an average particle diameter of the particles is no greater than 20 nm.

4. The radiation-sensitive composition according to claim 1, wherein an average particle diameter of the particles is no greater than 20 nm.

5. The radiation-sensitive composition according to claim 1, wherein the particles further comprise a ligand derived from an organic acid.

6. The radiation-sensitive composition according to claim 5, wherein the organic acid is at least one selected from the group consisting of a carboxylic acid, a sulfonic acid, a sulfinic acid, an organic phosphinic acid, an organic phosphonic acid, a phenol, an enol, a thiol, an acid imide, an oxime, and a sulfonamide.

7. The radiation-sensitive composition according to claim 5, wherein the organic acid is a carboxylic acid.

8. The radiation-sensitive composition according to claim 5, wherein the organic acid is at least one selected from the group consisting of methacrylic acid, tiglic acid, benzoic acid, m-toluic acid, o-toluic acid, and 3-iodobenzoic acid.

9. The radiation-sensitive composition according to claim 5, wherein a percentage content of the ligand derived from the organic acid is from 40 to 95% by mass.

10. The radiation-sensitive composition according to claim 1, wherein the radiation-sensitive acid generator is an onium salt.

11. The radiation-sensitive composition according to claim 10, wherein the onium salt is a sulfonium salt.

12. The radiation-sensitive composition according to claim 1, wherein the percentage content of the at least one metal atom with respect to the total metal atoms in the radiation-sensitive composition is no less than 80 atomic %.

13. The radiation-sensitive composition according to claim 1, wherein the van der Waals volume of an acid generated from the radiation-sensitive acid generator is no less than $3.0 \times 10^{-28}$ m$^3$.

14. A pattern-forming method comprising:
    applying the radiation-sensitive composition according to claim 1 to form a film on a substrate;
    exposing the film; and
    developing the film exposed.

15. The pattern-forming method according to claim 14, wherein a developer solution used in the developing is an alkaline aqueous solution.

16. The pattern-forming method according to claim 15, wherein a radioactive ray used in the exposing is an extreme ultraviolet ray or an electron beam.

17. The pattern-forming method according to claim 14, wherein a developer solution used in the developing is an organic solvent-containing liquid.

18. The pattern-forming method according to claim 17, wherein a radioactive ray used in the exposing is an extreme ultraviolet ray or an electron beam.

19. The pattern-forming method according to claim 14, wherein a radioactive ray used in the exposing is an extreme ultraviolet ray or an electron beam.

20. The radiation-sensitive composition according to claim 5, wherein the radiation-sensitive composition consists of:
    the particles;
    the radiation-sensitive acid generator;
    the solvent;
    optionally, a ligand other than the ligand derived from the organic acid; and
    optionally, a surfactant.

* * * * *